United States Patent [19] [11] 4,115,003
Nachtrieb [45] Sep. 19, 1978

[54] GRAPHIC AID AND METHOD AND SYSTEM OF MAKING REPRODUCTIONS THEREFROM

[75] Inventor: Robert W. Nachtrieb, Villa Park, Ill.

[73] Assignee: Fotel Inc., Villa Park, Ill.

[21] Appl. No.: 702,419

[22] Filed: Jul. 6, 1976

[51] Int. Cl.² .................. G03B 27/02; G03B 27/32
[52] U.S. Cl. .................................. 355/133; 96/36.2;
354/292; 355/77; 355/132
[58] Field of Search ................ 354/292; 355/77, 125,
355/132, 133; 96/27 E, 36.2, 38.1, 43

[56] References Cited
U.S. PATENT DOCUMENTS

| 3,169,063 | 2/1965 | Johnston et al. | 96/36.2 X |
| 3,264,105 | 8/1966 | Houtz | 96/36.2 |
| 3,288,607 | 11/1966 | Middleton | 96/36.2 X |
| 3,657,983 | 4/1972 | Baker | 354/292 |
| 3,663,223 | 5/1972 | Camenzind | 96/36.2 |
| 3,769,895 | 11/1973 | Lucas | 354/292 |

Primary Examiner—Fred L. Braun
Attorney, Agent, or Firm—Neuman, Williams, Anderson & Olson

[57] ABSTRACT

A graphic aid and method and system associated therewith are provided for producing aligned patterns in registry such as circuit board patterns and portions thereof. Certain features of the invention make it especially useful in fabricating multiple patterns which are discrete but in registry and in which one pattern represents a portion common with all the rest. Such a system is exemplified by two sided or multilayer circuit boards. The aid includes a diaphanous layout sheet whereon one or more sets of light absorptive pattern elements and reflective marks are arranged to conform to desired circuit patterns for the surfaces of a printed circuit board. A light absorptive background sheet is also provided and it is selectively positioned behind the layout sheet, to produce visible contrast with the reflective pattern marks thereon. In applying the invention to two-sided or multilayer printed circuit boards, the absorptive pattern elements are diaphanous and the absorptive pattern elements for each side or layer have a unique light filtering characteristic. A photographic image taken while frontlighting the aid will show by reflected light the position of the reflective pattern marks relative to the absorptive circuit pattern elements contained on the layout sheet which cannot be seen against the absorptive background sheet. In a similar fashion, backlighting the layout sheet with the background sheet removed and with a filter placed behind the layout sheet corresponding to one and then another set of diaphanous pattern elements, will produce light patterns from which photographic images of the front and back side circuit patterns or individual layers thereof can be produced.

20 Claims, 4 Drawing Figures

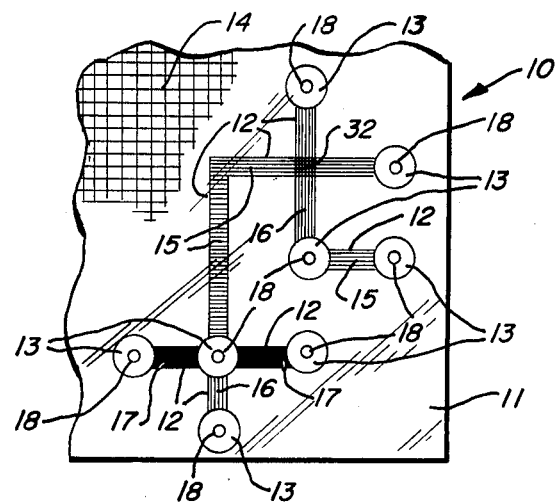
FIG. 1
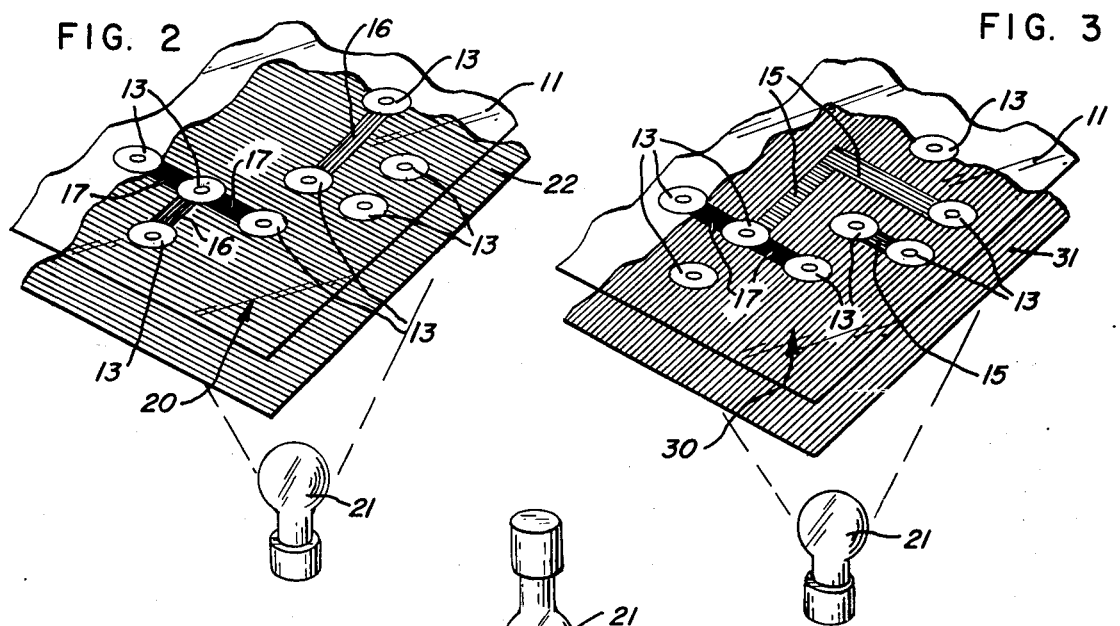
FIG. 2
FIG. 3
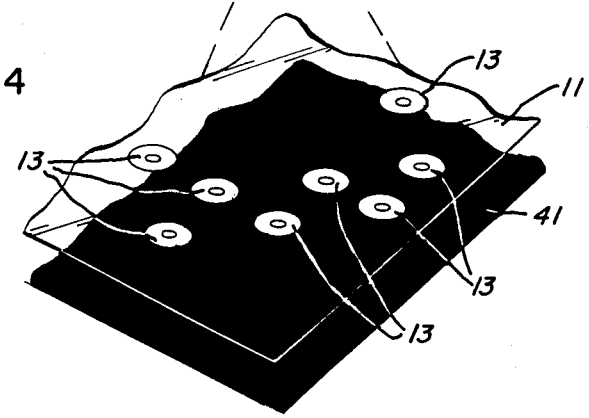
FIG. 4

GRAPHIC AID AND METHOD AND SYSTEM OF MAKING REPRODUCTIONS THEREFROM

BACKGROUND OF THE INVENTION

This invention relates to graphic aids and methods and systems associated therewith. Certain features of the invention make it especially useful in fabricating multiple patterns which are discrete but in registry and in which one pattern represents a portion common with all the rest. Such a system is exemplified by two sided or multilayer circuit boards. For simplicity the remainder of this specification will describe the invention as it is specifically applied to fabricating printed circuit patterns and resist patterns. The reader should be aware that the invention can be applied to other similar products.

Many electronic devices such as printed circuits and the like include one or more conductors which are, for example, printed, plated, etched or formed by a chemical deposition process on a base of insulating material. Many such circuits are two-sided or multilayered. A photographic negative or positive which depicts the circuit pattern for the board, the front and back-side of a two sided board or a plurality of layers of a multilayer board, is often utilized in producing a functional printed circuit board. Once the circuit pattern has been prepared on the base of the board, it is frequently necessary to selectively apply solder to particular portions of the circuit patterns to facilitate the making of permanent connections with the circuit board. These are generally pad areas defined by preferably round marks in the pattern. A protective covering of material, generally called a "solder resist" is frequently applied over the printed circuit patterns to conserve solder by covering all but the marked pad areas where solder joints are to be made. The solder resist also helps avoid shorts in the finished product and thus assures maintenance free operation of the board.

Ordinarily, more than one sheet including drawings or other pictorial representations of the circuit patterns and resist marks in accurate relative registration, must be made. To assure accurate relative positions while at the same time conserving time, labor and materials, it is desirable to produce the necessary pictorial representations (i.e., of circuit patterns and resist mark pattern) from a single layout sheet. While techniques have been known heretofore for making front and back-side circuit patterns from one layout sheet, a separate layout sheet has been necessary to produce a pictorial representation of the resist marks that would generate a photographically distinct image from the circuit patterns.

However, because a separate layout sheet was necessary, additional labor, material and time were required, oftentimes without the appropriate degree of accuracy necessary to assure proper alignment of the resist marks with the circuit patterns.

OBJECTS OF THE INVENTION

Accordingly, it is an object of the present invention to provide an improved, low cost, and simplified graphic aid and method associated therewith for producing aligned circuit board patterns and portions thereof for the fabrication of printed circuit boards.

It is another object of this invention to provide a graphic aid and method associated therewith which assures accurate and precise photographic reproduction of preselected circuit patterns and resist marks, in aligned relation.

It is still another object of this invention to provide a graphic aid and method associated therewith whereby circuit patterns for a printed circuit board, as well as marks for a resist pattern or the like can be produced from a single layout sheet.

It is another object of this invention to utilize a pattern employing pattern elements and portions having a plurality of reflective, absorptive and transmissive characteristics to enable the preparation of a plurality of different patterns from one master layout and thus insure optimum registry.

Further and additional objects will appear from the description, accompanying drawings and appended claims.

SUMMARY OF THE INVENTION

In accordance with one embodiment of this invention, a graphic aid is provided which includes a master grid layout sheet made from a diaphanous material. A first set of diaphanous pattern strips, having the same filtering characteristic or hue, are positioned on the layout sheet to conform to a desired printed circuit board pattern. A second set of diaphanous pattern strips, of a different filtering characteristic or hue, are likewise positioned on the layout sheet in conformity with another circuit board pattern. The term "diaphanous" is used to include any material through which useful light is transmitted. The terms "transparent" or "translucent" if used herein are intended to convey the same meaning. The two diaphanous patterns may, for example, represent the two opposite circuit patterns for a two-sided printed circuit board. In the case where the two pattern strips would overlap or correspond along their length, an opaque pattern strip may be utilized. When the term "opaque" is used herein to describe a pattern, the intended meaning is a degree of nontransparency relative to the diaphanous elements whereby the passage of photographically distinguishable light is blocked sufficiently to provide on a photosensitive web an image representing an opaque pattern.

A pattern element with an optical density as low as 1.10 may, with proper lighting and control effectively be rendered opaque although densities in excess of 1.75 are preferred. These numbers appear applicable where for example red diaphanous patterns are employed having an optical density of 0.80 to red light and an optical density of 3.6 to blue light. All of these must, of course, be adjusted for the particular light hue, spectral film response and other variables.

Wherever a terminal pad or through-board connection is desired, an opaque pattern mark or resist mark which is highly reflective may be used on the layout sheet. As such, when the layout sheet is backlit through a filter corresponding to the first and then second set of translucent patterns, and through the opaque common circuit patterns and the opaque pads or marks, opaque images of two circuit board patterns will be produced. When, on the other hand, a highly absorptive background sheet is positioned behind the layout sheet, and the layout sheet is front lit, a reflected image of the pads or resist marks will be produced selectively.

It should be understood that if the graphic aid and method of this invention are being used to fabricate products such as single sided printed circuit boards, opaque absorptive patterns of any type can be employed for the circuit pattern while opaque reflective marks are employed for the pads or resist pattern. The patterns and marks may be pre-cut or custom cut and may be straight strips and circles as shown or various curved or free-form shapes.

BRIEF DESCRIPTION OF THE DRAWINGS

For a complete understanding of this invention, reference should now be made to the embodiment illustrated in greater detail in the accompanying drawings and described below by way of an example of the invention. The detailed embodiment is for fabricating a two sided printed circuit board although the same principles will apply to single sided and multilayer boards and other applications of the teaching.

IN THE DRAWINGS

FIG. 1 is a fragmentary plan view of a master layout sheet with a plurality of circuit patterns having different spectral characteristics positioned thereon;

FIG. 2 is a fragmentary perspective view of the master layout sheet of FIG. 1, shown backlit through a red filter;

FIG. 3 is a fragmentary perspective view of the master layout sheet of FIG. 1, shown backlit through a blue filter; and FIG. 4 is a fragmentary perspective view of the master layout sheet of FIG. 1, shown frontlit with an absorptive background sheet positioned therebehind.

DESCRIPTION OF THE PREFERRED EMBODIMENT

Turning now to the drawings and principally FIG. 1, a graphic aid according to a preferred embodiment of the invention is shown generally at 10. The aid includes a layout sheet 11, having positioned thereon pattern strips 12 of predetermined length, color and transparency, and pattern pads or marks 13 selectively located at end portions of strips 12 and at other predetermined locations along the strips 12. The layout sheet 11 is of a diaphanous material and may be provided with a grid pattern of reference lines thereon 14, to assist in the accurate placement of pattern strips 12 and pattern marks 13. The reference lines 14 are printed on the layout sheet 11 so as to be photographically undetectable under appropriate lighting and filming conditions as taught in Baker's U.S. Pat. No. 3,657,983.

The diaphanous sheet 11 is preferably clear polyester and the pattern strip 12 preferably colored acetate or other material with a pressure sensitive adhesive coating so that the strips act as light filters. The pads or marks 13 are preferably adhesively coated die cut white paper, mylar or similar opaque reflective material. The same result is achieved by printing with an opaque white ink or paint on an adhesively coated acetate or polyester base.

Positioned on the layout sheet 11 according to a predetermined design, are colored translucent strips 15 and 16, and opaque strips 17 of an absorptive color such as black. In the embodiment illustrated, a circuit board design for the front side of a printed circuit board (not shown) is depicted by the location of red translucent strips 15 and black opaque strips 17. The circuit board design for the back side of a printed circuit board is depicted by blue translucent strips 16 and the black opaque strips 17. As is shown, the strips may be cut to any desired length to more easily conform to any circuit design. For reasons more fully explained below, where circuit paths correspond along a segment of their length, an opaque and preferably black strip 17 will be utilized instead of overlapping red and blue translucent strips.

In addition to the strips 15, 16 and 17 placed on the layout sheet 11, resist marks or terminal pads 13 are selectively positioned thereon as required by the circuit board design. Each mark 13 is of an opaque and reflective, preferably white material. The marks 13 are commonly circular in shape, and are provided with an opening 18 centrally located therein. The opening 18 is provided to allow the mark 13 to be accurately positioned over reference lines 14 on layout sheet 11. With the strips 15, 16, 17 and marks 13 in place on the layout sheet 11 as described, three distinct photographic images, as shown in FIGS. 2, 3 and 4 may be reproduced from the layout sheet 11, to be utilized in accurately printing front and back circuit patterns and the solder resist pattern associated therewith, on a circuit board.

As illustrated in FIG. 2, a first image 20 is produced when the layout sheet 11 is backlit by a light source 21 through a red filter 22. In such a configuration, the red translucent pattern strips 15 are effectively transparent so as to be photographically indistinguishable from the surrounding layout sheet 11 while the blue pattern is effectively opaque to the red light. The resulting opaque image 20 of blue and black strips and white pads, corresponds to the circuit board pattern that would appear on the back side of the circuit board. Because red and blue are contrasting colors, the blue strips 16 cast an opaque image when backlit through the red filter 22. In the same fashion, the black opaque strip 17 and the white pattern marks 13 cast a photographically similar opaque image when backlit. As such, a photographic negative of this configuration would be adapted for use in printing the back side circuit pattern onto a printed circuit board.

In a similar fashion, FIG. 3 illustrates the opaque image 30 formed when the layout sheet 11 is backlit by a light source 21 through a blue filter 31. In this arrangement, the blue translucent pattern strips 16 are effectively transparent so as to be photographically indistinguishable from the surrounding layout sheet 11. While the red strips are effectively rendered opaque to the blue light, the opaque image 30 resulting from the blue exposure corresponds to the circuit board pattern that would appear on the front side of the circuit board. The red pattern strips 15, when backlit through a blue filter 31, cast an opaque image. Similarly, the black opaque strip 17 and white opaque marks 13 cast an opaque image when backlit. Because the circuit patterns for both the front and back side of the circuit board include pattern portions that correspond along strip 17, an opaque image of strip 17 would be cast when the layout sheet 11 is backlit through either the blue or red filter. Thus, instead of positioning a blue and red pattern strip on top of one another along the corresponding path, a single opaque strip accomplishes the same result. However, where it would be inconvenient or require additional labor, the red and blue translucent strips may cross or overlap, as at 32 (FIG. 1), without necessitating the utilization of a black opaque strip.

For the same reasons, the pattern marks 13 are also formed from an opaque material, and appear as part of the opaque image formed for each side or layer circuit pattern.

Because it is desirable to selectively complete the circuit by securing components to the circuit board at pad locations, a solder material is applied in and around the terminal pads 13, on at least one side or layer of a circuit board. A photographic negative or positive depicting the location of each terminal pad 13 is particularly useful in preparing a pattern for a protective coating or solder resist for all but the locations where solder is desired. Such an image is created when the layout sheet 11 is frontlit from a light source 21, with a black or other light absorptive background sheet 41 positioned behind the layout sheet 11, as shown in FIG. 4. The white terminal pads 13 contrast with the background sheet 41 to produce a photographically distinct image. The red, blue and black strips 15, 16, 17 when disposed on the absorptive background are of the same order of light absorption as the black background sheet 41, so that they are effectively invisible against the background sheet 41 and do not produce a photographically distinct image.

It will thus be understood by those skilled in the art that by including registration marks on the graphic aid and reproducing multiple masters from the single composite layout, the photographic images thus produced may be effectively utilized in accurately and efficiently preparing printed circuit boards of single or multiple layers, and in applying a resist pattern for solder material or the like to define selected terminal pads.

The technique employed to print the desired circuit patterns on a printed circuit board is described in the Baker U.S. Pat. No. 3,657,983 which issued on Apr. 25, 1972. In addition to the techniques described therein, it is desirable that a technique be employed to generate open areas in the solder resist which are larger than the pad areas of the circuit pattern. This is to assure solder coverage of the pad and is accomplished according to this invention by employing means to "spread" the image of the pattern marks. By spreading or enlarging the marks in making the resist master slightly larger pattern mark images will be produced to expose all of the underlying metal pads and perhaps even a small amount of the adjacent circuitry pattern and/or insulating board. Clear film layers may be interleafed between the sensitive film and the negative of the pad mark image from which the resist master is being made. The positive resulting from exposing the sensitive film, as described above, will reflect the spread image of the pattern marks by virtue of light diffusion in the intermediate clear film layers and the boundaries therebetween. Employing a contact negative of the positive to create a silk screen or the like for applying solder resist to all but the areas of the pattern marks, will insure that the solder will make positive contact only with the metal of the printed circuit in the pad areas on the circuit board.

Other techniques can be employed to generate a spread image of the opaque white pattern marks to generate a solder resist master with slightly enlarged pattern areas to overlie the pads of the metallic pattern. Such techniques as slight defocusing of the projected image in preparing the ultimate silk screen or oscillating the sensitive material or the light source have been used but in general they provide a pattern which is less satisfactory than that produced by placing one or more layers of clear film between the original negative and the sensitive film in a contact printing operation.

It will be seen from the foregoing that this invention provides a new graphic aid as well as a new method and system for producing multiple masters from a single original layout where registry is insured by the use of a single layout and pattern elements of a plurality of light transmissive, light absorptive, and light reflective characteristics in conjunction with backlighting and frontlighting with light sources of spectral characteristics correlated to the pattern elements and background sheet means having light absorptive characteristics also correlated with the pattern elements. This combination and the method and system employing it has proven especially unique and valuable in the preparation of multiple, registered masters from one layout for the production of printed circuit products.

What is claimed is:

1. A graphic aid for reproducing a first graphic pattern and a second graphic pattern in registry therewith comprising;
   a diaphanous sheet,
   a first pattern of effectively light absorptive material on said sheet, defining portions of said first graphic pattern,
   a second pattern of opaque and effectively light reflective material on said sheet, in registry with said first pattern and defining simultaneously, portions of said first graphic pattern and said second graphic pattern, and
   removable means selectively underlying said diaphanous sheet to render said sheet effectively light absorptive whereby said diaphanous sheet simultaneously includes thereon said pattern-defining material for each of said patterns and said second pattern has a contrasting light reflective characteristic relative to said first pattern and said sheet and underlying means such that light may be reflected from said second pattern to define a separately distinguishable second graphic pattern.

2. The graphic aid of claim 1 wherein said first graphic pattern is a printed circuit pattern and said second graphic pattern is a solder resist pattern.

3. The graphic aid of claim 2, wherein said second pattern is substantially circular in shape, and is selectively positionable on said sheet along a portion of said first pattern.

4. The graphic aid of claim 2, wherein said removable means is light-absorptive and coextensive with said diaphanous sheet.

5. The graphic aid of claim 2, wherein said first pattern comprises translucent strips of predetermined length, selectively positionable on said sheet to conform to desired circuit designs.

6. The graphic aid of claim 5, wherein translucent strips of a first hue are selectively positionable on said sheet to conform to a first circuit design and translucent strips of a second hue are selectively positionable on said sheet to conform to a second circuit design.

7. The graphic aid of claim 6, wherein each of said circuit designs include at least one of said second patterns.

8. The graphic aid of claim 7, wherein an opening generally is defined by said second pattern and is adapted to facilitate accurate placement of said second pattern on said sheet.

9. The graphic aid of claim 6, wherein the hues of said first and second strips contrast, yet have similar light reflectivity.

10. The graphic aid of claim 9, wherein an opaque strip of similar light reflectivity to said translucent strips are positionable on said sheet where said first circuit design and said second circuit design overlie one another.

11. A system for assuring positive registration of selected circuit patterns and portions thereof on circuit boards comprising:

a single layout sheet of diaphanous material;

effectively light absorptive pattern strips positionable on said layout sheet and corresponding to predetermined circuit patterns;

effective light reflective pattern pads positionable on said layout sheet in registry with said light absorptive pattern strips and defining simultaneously, portions of said predetermined circuit patterns and a solder resist pattern;

removable means selectively underlying said sheet to render said sheet effectively light abosorptive, whereby said reflecting pattern pads have a contrasting light reflective characteristic relative to said pattern strips and said sheet and said underlying means, and delimit a separately distinguishable graphic pattern.

12. The system of claim 11, wherein said effectively light absorptive pattern strips comprise a plurality of predetermined designs, of translucent strips, the strips forming each of said designs having a hue which contrasts with the hue of each other design.

13. The system of claim 11, wherein said effectively reflective pattern pads comprise generally circular pads of the same hue with one another.

14. The system of claim 11, wherein said removable means is coextensive with said layout sheet and is of a light absorptive material.

15. A method of producing multiple patterns from a single diaphanous layout sheet comprising;

applying an effectively light absorptive and opaque pattern for desired first patterns to said layout sheet;

applying an opaque and effectively light reflecting pattern simultaneously defining portions of said first patterns and desired second patterns, to said layout sheet;

photographically reproducing said desired first patterns from said layout sheet by backlighting said layout sheet; and photographically reproducing said desired second patterns from said layout sheet by frontlighting said layout sheet.

16. A method of producing patterns for first graphic patterns and for second graphic patterns in registry with said first graphic patterns comprising:

applying an effectively light absorptive and opaque pattern for certain portions of said first graphic patterns to a diaphanous layout sheet;

applying an opaque, effectively light reflective pattern, simultaneously defining other portions of said first graphic patterns and second graphic pattern on said layout sheet in registry with said light absorptive pattern;

photographically reproducing the pattern for said first graphic pattern and said second graphic portions of said layout sheet by backlighting said layout sheet; and photographically reproducing the pattern for said second graphic pattern by frontlighting said layout sheet.

17. The method of claim 16 wherein said first graphic pattern comprises the conductive portions of a printed circuit board and said second graphic pattern comprises the solder resist pattern.

18. A method of producing aligned patterns for circuit boards and selected portions of said patterns comprising:

applying first translucent pattern strips having a first light transmissive characteristic to a layout sheet of diaphanous material in a first predetermined pattern;

applying second translucent pattern strips having a second light transmissive characteristic to said layout sheet in a second predetermined pattern;

applying reflective opaque pattern pads to said layout sheet;

backlighting said layout sheet through a filter corresponding to said first translucent strips;

recording the image of said layout sheet so lit;

backlighting said layout sheet through a filter corresponding to said second translucent strips;

recording the image of said layout sheet so lit;

frontlighting said layout sheet; and recording the image of said layout sheet, whereby said recorded images may be selectively utilized to print desired circuit patterns onto a circuit board.

19. The method of claim 18, wherein opaque light absorptive pattern strips are applied to said layout sheet where said first predetermined pattern and said second predetermined patterns overlie one another along their length.

20. The method of claim 18, wherein said opaque light reflective pattern pads are positioned on said layout sheet at selective end portions of said pattern strips and other selective positions along said pattern strips.

* * * * *